(12) United States Patent
Sabate et al.

(10) Patent No.: US 9,389,288 B2
(45) Date of Patent: Jul. 12, 2016

(54) SYSTEM AND METHOD FOR MAINTAINING SOFT SWITCHING CONDITION IN A GRADIENT COIL DRIVER CIRCUIT

(75) Inventors: Juan Antonio Sabate, Niskayuna, NY (US); Rixin Lai, Clifton Park, NY (US); Lei Wang, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 768 days.

(21) Appl. No.: 13/618,909

(22) Filed: Sep. 14, 2012

(65) Prior Publication Data
US 2014/0077812 A1      Mar. 20, 2014

(51) Int. Cl.
*G01R 33/34* (2006.01)
*G01R 33/341* (2006.01)
*G01R 33/385* (2006.01)

(52) U.S. Cl.
CPC .............. *G01R 33/34* (2013.01); *G01R 33/341* (2013.01); *G01R 33/3852* (2013.01); *G01R 33/3854* (2013.01)

(58) Field of Classification Search
CPC .. G01R 33/34; G01R 33/341; G01R 33/3852; G01R 33/3854; G01R 19/0038
USPC ........................... 324/300–322; 600/407–422
See application file for complete search history.

(56) References Cited

U.S. PATENT DOCUMENTS

| | | | |
|---|---|---|---|
| 4,961,054 A * | 10/1990 | Park ..................... | H03K 17/567 324/322 |
| 5,105,153 A * | 4/1992 | Mueller ............. | G01R 33/3852 324/322 |
| 5,198,969 A | 3/1993 | Redl et al. | |
| 5,270,657 A * | 12/1993 | Wirth et al. .................... | 324/322 |
| 5,442,540 A | 8/1995 | Hua et al. | |
| 6,069,806 A * | 5/2000 | Lenz et al. ....................... | 363/70 |
| 6,356,462 B1 | 3/2002 | Jang et al. | |
| 6,424,101 B1 | 7/2002 | Sabate | |

(Continued)

FOREIGN PATENT DOCUMENTS

WO         2005022732 A2      3/2005

OTHER PUBLICATIONS

Aigner, Hubert, et al.; "Improving the Full-bridge Phase-shift ZVT Converter for Failure-free Operation Under Extreme Conditions in Welding and Similar Applications", Advanced Power Technology, Dec. 1998, pp. 1-10.

(Continued)

*Primary Examiner* — Melissa Koval
*Assistant Examiner* — Rishi Patel
(74) *Attorney, Agent, or Firm* — Melissa K. Dobson

(57) ABSTRACT

In one embodiment, a system includes a gradient coil driver configured to supply electrical signals to a gradient coil of a magnetic resonance imaging system. The gradient coil driver includes an electronic circuit. The electronic circuit includes a first H-bridge circuit electrically coupled to a power source. The first H-bridge includes a plurality of metal-oxide-semiconductor field-effect transistor (MOSFET) switches; and a plurality of diodes electrically coupled in parallel with each MOSFET switch. Each diode of the plurality of diodes is configured to conduct current to cause zero voltage potential across a source and a drain of one of the plurality of MOSFET switches. The first H-bridge also includes a load configured to regulate currents flowing through each of the plurality of diodes and each MOSFET switch of the plurality of MOSFET switches.

15 Claims, 9 Drawing Sheets

(56) References Cited

U.S. PATENT DOCUMENTS

| | | | |
|---|---|---|---|
| 6,879,852 B1* | 4/2005 | Mueller | 600/410 |
| 6,930,483 B2 | 8/2005 | Sabate et al. | |
| 6,988,826 B2 | 1/2006 | Zribi et al. | |
| 7,116,166 B2 | 10/2006 | Sabate et al. | |
| 7,327,092 B2 | 2/2008 | Caiafa et al. | |
| 7,439,682 B2 | 10/2008 | Caiafa et al. | |
| 7,714,583 B2 | 5/2010 | Zhu et al. | |
| 7,915,944 B2 | 3/2011 | Caiafa et al. | |
| 2006/0114623 A1* | 6/2006 | Domoto | G01R 33/3852 361/18 |
| 2099/0231890 | 9/2009 | Schutten et al. | |
| 2010/0045113 A1* | 2/2010 | Hishikawa | G01R 33/3614 307/77 |
| 2011/0187369 A1 | 8/2011 | Rivas Davila et al. | |
| 2011/0249472 A1 | 10/2011 | Jain et al. | |
| 2011/0273909 A1 | 11/2011 | Christopher | |
| 2012/0007571 A1* | 1/2012 | Huisman | 323/271 |
| 2012/0026754 A1 | 2/2012 | Ye | |
| 2012/0049635 A1 | 3/2012 | Schelenz et al. | |
| 2012/0051095 A1 | 3/2012 | Steigerwald et al. | |
| 2012/0193992 A1* | 8/2012 | Heuermann | 307/84 |
| 2012/0249145 A1 | 10/2012 | Lai et al. | |
| 2012/0274139 A1 | 11/2012 | Agamy et al. | |
| 2013/0099787 A1* | 4/2013 | Lu | H02M 3/3376 324/319 |
| 2013/0099788 A1* | 4/2013 | Xu | H02M 3/3376 324/322 |

OTHER PUBLICATIONS

Kamil, Mohammad; "Switch Mode Power Supply (SMPS)", Microchip Techology, 2007, pp. 1-48.

Dudrik, Jaroslav, et al.; "High-Frequency Soft-Switching DC-DC Converters for Voltage and Current DC Power Sources", Acta Polytechnica Hungarica, vol. 4, Issue 2, 2007, pp. 29-46.

Lai, Rixin, et al.; "A High Efficiency Two-Phase Interleaved Inverter for Wide Range Output Waveform Generation", Energy Conversion Congress and Exposition (ECCE, 2012 IEEE, Sep. 2012, pp. 4533-4537.

* cited by examiner

SYSTEM AND METHOD FOR MAINTAINING SOFT SWITCHING CONDITION IN A GRADIENT COIL DRIVER CIRCUIT

BACKGROUND

In general, magnetic resonance imaging (MRI) examinations are based on the interactions among a primary magnetic field, a radiofrequency (RF) magnetic field and time varying magnetic gradient fields with gyromagnetic material having nuclear spins within a subject of interest, such as a patient. Certain gyromagnetic materials, such as hydrogen nuclei in water molecules, have characteristic behaviors in response to external magnetic fields. The precession of spins of these nuclei can be influenced by manipulation of the fields to produce RF signals that can be detected, processed, and used to reconstruct a useful image.

The magnetic fields used to generate images in MRI systems include a highly uniform, static magnetic field that is produced by a primary field magnet. A series of gradient fields are produced by a set of gradient coils located around the subject. The gradient fields encode positions of individual plane or volume elements (pixels or voxels) in two or three dimensions. An RF coil is employed to produce an RF magnetic field. This RF magnetic field perturbs the spins of some of the gyromagnetic nuclei from their equilibrium directions, causing the spins to precess around the axis of their equilibrium magnetization. During this precession, RF fields are emitted by the spinning, precessing nuclei and are detected by either the same transmitting RF coil, or by one or more separate coils. These signals are amplified, filtered, and digitized. The digitized signals are then processed using one or more algorithms to reconstruct a useful image.

BRIEF DESCRIPTION

In one embodiment, a system includes a gradient coil driver configured to supply electrical signals to a gradient coil of a magnetic resonance imaging system. The gradient coil driver includes an electronic circuit. The electronic circuit includes a first H-bridge circuit electrically coupled to a power source. The first H-bridge includes a plurality of metal-oxide-semiconductor field-effect transistor (MOSFET) switches; and a plurality of diodes electrically coupled in parallel with each MOSFET switch. Each diode of the plurality of diodes is configured to conduct current to cause zero voltage potential across a source and a drain of one of the plurality of MOSFET switches. The first H-bridge also includes a load configured to regulate currents flowing through each of the plurality of diodes and each MOSFET switch of the plurality of MOSFET switches.

In another embodiment, a retrofit kit is provided that includes an electronic circuit configured to replace an existing electronic circuit in a gradient coil driver configured to supply electrical signals to a gradient coil of a magnetic resonance imaging system. The electronic circuit includes a first H-bridge circuit electrically coupled to a power source. The first H-bridge includes a plurality of metal-oxide-semiconductor field-effect transistor (MOSFET) switches; and a plurality of diodes electrically coupled in parallel with each MOSFET switch. Each diode of the plurality of diodes is configured to conduct current to cause zero voltage potential across a source and a drain of one of the plurality of MOSFET switches. The first H-bridge circuit also includes a load configured to regulate currents flowing through each of the plurality of diodes and each MOSFET switch of the plurality of MOSFET switches.

In another embodiment, a magnetic resonance imaging (MRI) system is provided, which includes a primary field magnet configured to place gyromagnetic nuclei within a patient into an equilibrium magnetization; a plurality of gradient coils configured to encode positional information into the gyromagnetic nuclei in response to an applied voltage; a radiofrequency (RF) transmit coil configured to perturb the gyromagnetic nuclei away from their equilibrium magnetization; and control circuitry coupled to the gradient coils, to the RF transmit coil, and to the plurality of RF receiving coils. The control circuitry is configured to apply control signals to the gradient, RF transmit coils, or any combination thereof. The system also includes a power system configured to drive the voltage applied to the plurality of gradient coils. The power system includes a gradient coil driver circuit configured to supply electrical signals to at least one of the gradient coils. The gradient coil driver includes an electronic circuit. The electronic circuit includes one or more H-bridge circuits electrically coupled to a power source. The one or more H-bridges each include a plurality of metal-oxide-semiconductor field-effect transistor (MOSFET) switches; and a plurality of diodes electrically coupled in parallel with each MOSFET switch. Each diode of the plurality of diodes is configured to conduct current to cause zero voltage potential across a source and a drain of one of the plurality of MOSFET switches. The one or more H-bridges also each include a load configured to regulate currents flowing through each of the plurality of diodes and each MOSFET switch of the plurality of MOSFET switches.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
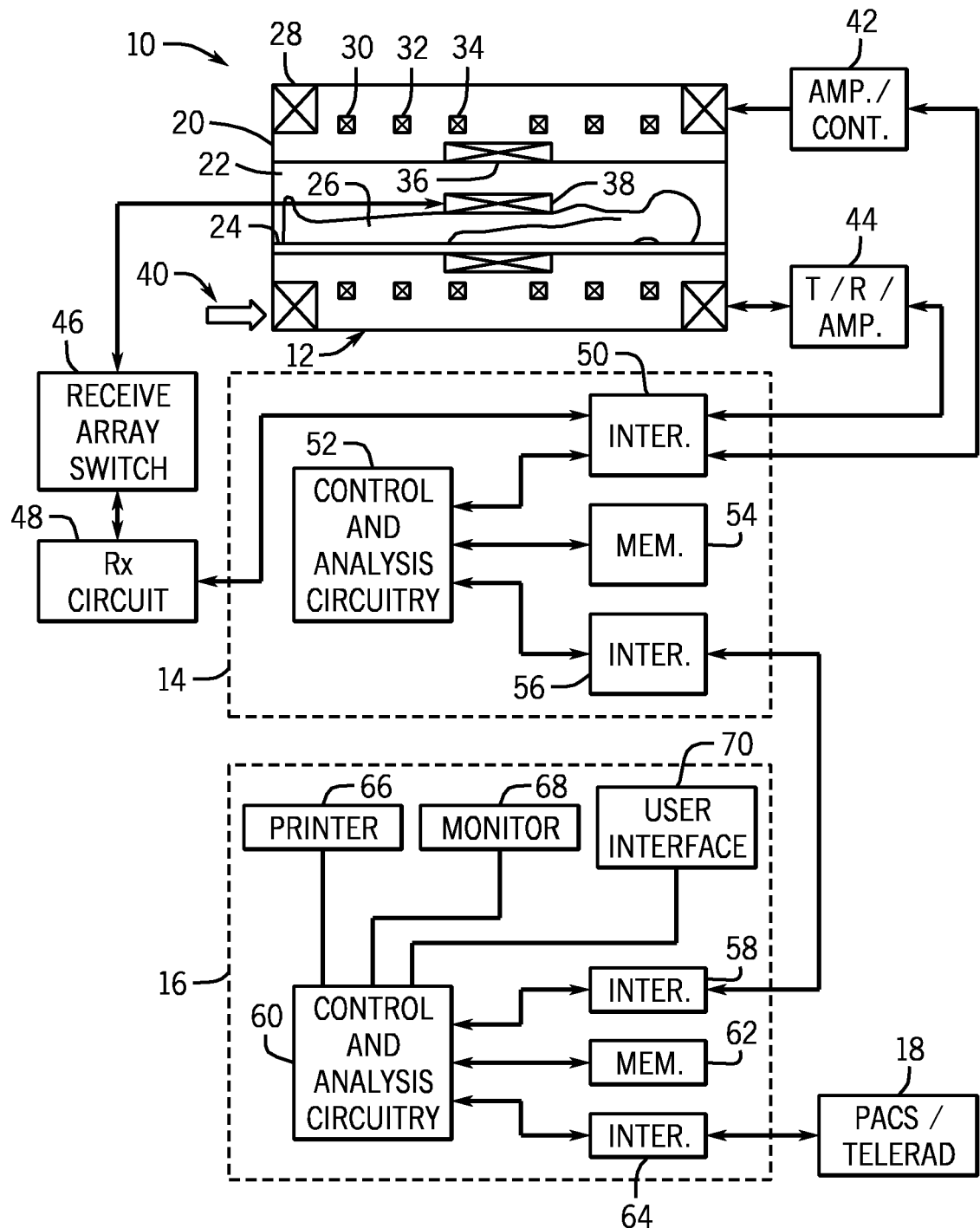
FIG. 1 is a diagrammatic illustration of an embodiment of a magnetic resonance imaging system configured to perform data acquisition and image reconstruction, in accordance with an aspect of the present disclosure.

One or more specific embodiments will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present invention, the articles "a," "an," "the," and "said" are intended to mean that there are one or more of the elements. The terms "comprising," "including," and "having" are intended to be inclusive and mean that there may be additional elements other than the listed elements.

As noted above, in MRI, gradient fields generated by gradient coils encode positions of individual plane or volume elements (pixels or voxels) in two or three dimensions. To enable such encoding, each gradient coil must be able to generate quick and accurate modifications to its magnetic field strength and direction. Generally, a gradient driver circuit is employed to generate the varying voltage signals used to create the quick and accurate modifications to each gradient coil's magnetic field. The driver circuit may include a series of switching circuits that are hard switched in conventional systems to produce the varying voltage signals.

Unfortunately, hard switching these switching circuits can generate a large amount of switching losses in the system, making the driver bulky and inefficient. Though the operating frequency of the hard switching circuit can be increased to reduce the size and weight of the passive components in an attempt to reduce response time, for the high power high voltage requirements of MRI, the relatively high amount of switching losses due to hard switching the gradient driver circuits can render such drivers insufficient or subject to further improvement. For example, hard switching in such circuits can produce a fast current or voltage transient, resulting in electromagnetic interference noise, which can be particularly problematic for MRI applications.

Present embodiments relate to systems and methods for a gradient driving circuit capable of maintaining a soft switching condition for metal-oxide-semiconductor field-effect transistor (MOSFET) switches, such as silicon carbide (SiC) MOSFET switches, or for insulated-gate bipolar transistor (IGBT) switches. Indeed, while the present disclosure presents certain embodiments in the context of MOSFET switches, it should be noted that some or all of the MOSFET switches disclosed herein may be replaced by an IGBT switch. For example, in one embodiment, a gradient driving circuit includes a two-phase H-bridge circuit. A digital controller may control switches of the gradient driving circuit to apply voltage signals across a pair of inductive loads (e.g., gradient coils) on each side of the two-phase H-bridge circuit. The voltage signals on each side of the two-phase H-bridge circuit operate with the same duty cycle and pulse width modulation profile, but with a flexible phase shift between the voltage signals on either side of the pairs of inductive loads. The phase shift between the voltage signals applied to either side of the pairs of the inductive loads along with current flow through diodes connecting the source and drain of each MOSFET (or IGBT) enables soft switching of the SiC MOSFET switches (or IGBT), improving the efficiency of the system and reducing the system size.

Using the soft-switching gradient coil driver circuits described herein, the MRI system may perform data acquisition in a rapid and controlled manner. The acquired data can be reconstructed, and an image synthesized therefrom using, for example, an MRI system. Referring to FIG. 1, a magnetic resonance imaging system 10 is illustrated schematically as including a scanner 12, scanner control circuitry 14, and system control circuitry 16, which together are used to acquire magnetic resonance data and produce an image of a subject of interest. System 10 additionally includes remote access and storage systems or devices such as picture archiving and communication systems (PACS) 18, or other devices such as teleradiology equipment so that data acquired by the system 10 may be accessed on- or off-site. While the MRI system 10 may include any suitable scanner or detector, in the illustrated embodiment, the system 10 includes a full body scanner 12 having a housing 20 through which a bore 22 is formed. A table 24 is moveable into the bore 22 to permit a patient 26 to be positioned therein for imaging selected anatomy within the patient.

The scanner 12 includes a series of associated coils for producing controlled magnetic fields for exciting the gyromagnetic material within the anatomy of the subject being imaged. Specifically, a primary magnet coil 28 is provided for generating a primary magnetic field generally aligned with the bore 22. A series of gradient coils 30, 32, and 34, all or some of which may be controlled by the gradient coil driver circuits described herein, permit controlled magnetic gradient fields to be generated for positional encoding of certain of the gyromagnetic nuclei within the patient 26 during examination sequences. A radio frequency (RF) coil 36 is provided, and is configured to generate radio frequency pulses for exciting the certain gyromagnetic nuclei within the patient. In addition to the coils that may be local to the scanner 12, the system 10 also includes a set of receiving coils 38 (e.g., an array of coils) configured for placement proximal (e.g., against) the patient 26. The receiving coils 38 may have any geometry, including both enclosed and single-sided geometries. As an example, the receiving coils 38 can include cervical/thoracic/lumbar (CTL) coils, head coils, single-sided spine coils, and so forth. Generally, the receiving coils 38 are placed close to or on top of the patient 26 so as to receive the weak RF signals (weak relative to the transmitted pulses generated by the scanner coils) that are generated by certain of the gyromagnetic nuclei within the patient 26 as they return to their relaxed state. The receiving coils 38 may be switched off so as not to receive or resonate with the transmit pulses generated by the scanner coils, and may be switched on so as to receive or resonate with the RF signals generated by the relaxing gyromagnetic nuclei.

The various coils of system 10 are controlled by external circuitry to generate the desired field and pulses, and to read emissions from the gyromagnetic material in a controlled manner. In the illustrated embodiment, a main power supply 40 provides power to the primary field coil 28. A driver circuit 42 which, in accordance with present embodiments includes a soft switching gradient coil driver circuit, is provided for pulsing the gradient field coils 30, 32, and 34. Aspects of the soft switching gradient coil driver circuit are discussed in further detail below with respect to FIGS. 2-10.

Generally, the circuit 42 may include amplification and control circuitry for supplying current to the coils as defined by digitized pulse sequences output by the scanner control circuit 14. Another control circuit 44 is provided for regulating operation of the RF coil 36. Circuit 44 includes a switching device for alternating between the active and inactive modes of operation, wherein the RF coil 36 transmits and does not transmit signals, respectively. Circuit 44 also includes amplification circuitry for generating the RF pulses. Similarly, the receiving coils 38 are connected to switch 46, which is capable of switching the receiving coils 38 between receiving and non-receiving modes. Additionally, a receiving circuit 48 is provided for receiving the data detected by the receiving coils 38, and may include one or more multiplexing and/or amplification circuits.

It should be noted that while the scanner 12 and the control/amplification circuitry described above are illustrated as being coupled by a single line, many such lines or connections may be present in an actual instantiation. For example, separate lines may be used for control, data communication, and so on. Further, suitable hardware may be disposed along each type of line for the proper handling of the data. Indeed, various filters, digitizers, and processors may be disposed between the scanner and either or both of the scanner and system control circuitry 14, 16.

As illustrated, scanner control circuit 14 includes an interface circuit 50, which outputs signals for driving the gradient field coils and the RF coil and for receiving the data representative of the magnetic resonance signals produced in examination sequences. The interface circuit 50 is coupled to a control and analysis circuit 52. The control and analysis circuit 52 executes the commands for driving the circuit 42 and circuit 44 based on defined protocols selected via system control circuit 16. Control and analysis circuit 52 also serves to receive the magnetic resonance signals and performs subsequent processing before transmitting the data to system control circuit 16. Scanner control circuit 14 also includes one or more memory circuits 54, which store configuration parameters, pulse sequence descriptions, examination results, and so forth, during operation. Interface circuit 56 is coupled to the control and analysis circuit 52 for exchanging data between scanner control circuit 14 and system control circuit 16.

System control circuit 16 includes an interface circuit 58, which receives data from the scanner control circuit 14 and transmits data and commands back to the scanner control circuit 14. The interface circuit 58 is coupled to a control and analysis circuit 60 which may include a CPU in a multi-purpose or application specific computer or workstation. Control and analysis circuit 60 is coupled to a memory circuit 62 to store programming code for operation of the MRI system 10 and to store the acquired image data for reconstruction, display and transmission. An additional interface circuit 64 may be provided for exchanging image data, configuration parameters, and so forth with external system components such as remote access and storage devices 18. Finally, the system control and analysis circuit 60 may include various peripheral devices for facilitating operator interface and for producing hard copies of the reconstructed images. In the illustrated embodiment, these peripherals include a printer 60, a monitor 62, and user interface 64 including devices such as a keyboard or a mouse.

Scanner 12 and the control and analysis circuit 52 associated therewith produce magnetic fields and radio frequency pulses in a controlled manner to excite and encode specific gyromagnetic material within the patient 26. The scanner 12 and control and analysis circuit 52 also sense the signals emanating from such material and create an image of the material being scanned. It should be noted that the MRI system described is merely intended to be exemplary only, and other system types, such as so-called "open" MRI systems may also be used. Similarly, such systems may be rated by the strength of their primary magnet, and any suitably rated system capable of carrying out the data acquisition and processing described below may be employed.

Again, present embodiments relate to a gradient coil driver circuit capable of soft switching to provide varying voltage signals to one or more gradient coils, such as those set forth above with respect to FIG. 1. One embodiment of a power system 70 for driving the gradient coils 30, 32, 34 of the MR scanner 12 of FIG. 1 is depicted diagrammatically in FIG. 2. The power system 70 may be disposed in an equipment room 74 and a scan room 76. The equipment room 74 may include an AC power source 78 electrically coupled to a diode rectifier 80. The diode rectifier may convert the alternating current from the AC power source 78 to direct current. The direct current may be carried into the scan room 76 and supplied to a high frequency isolated DC-to-DC converter 82. The high frequency isolated DC-to-DC converter 82 may convert the voltage being supplied by the diode rectifier 80 to a voltage appropriate for use by a gradient coil driver 84. The gradient coil driver 84 may receive digital signals from a digital controller 86 and output a voltage signal used to drive the gradient coils 30, 32, 34 of the magnetic resonance scanner 12. It should be noted that while the gradient coil driver 84 is depicted as being positioned within the scan room 76, any positioning scheme is presently contemplated, including configurations in which the gradient coil driver 84 is disposed in the equipment room 74. Indeed, it is presently contemplated that the components of the power system 70, including the converter 82, or the gradient coil driver 84, or the digital controller 86, or any combination thereof, may be disposed in the equipment room 74 rather than the scan room 76.

Figure 2:
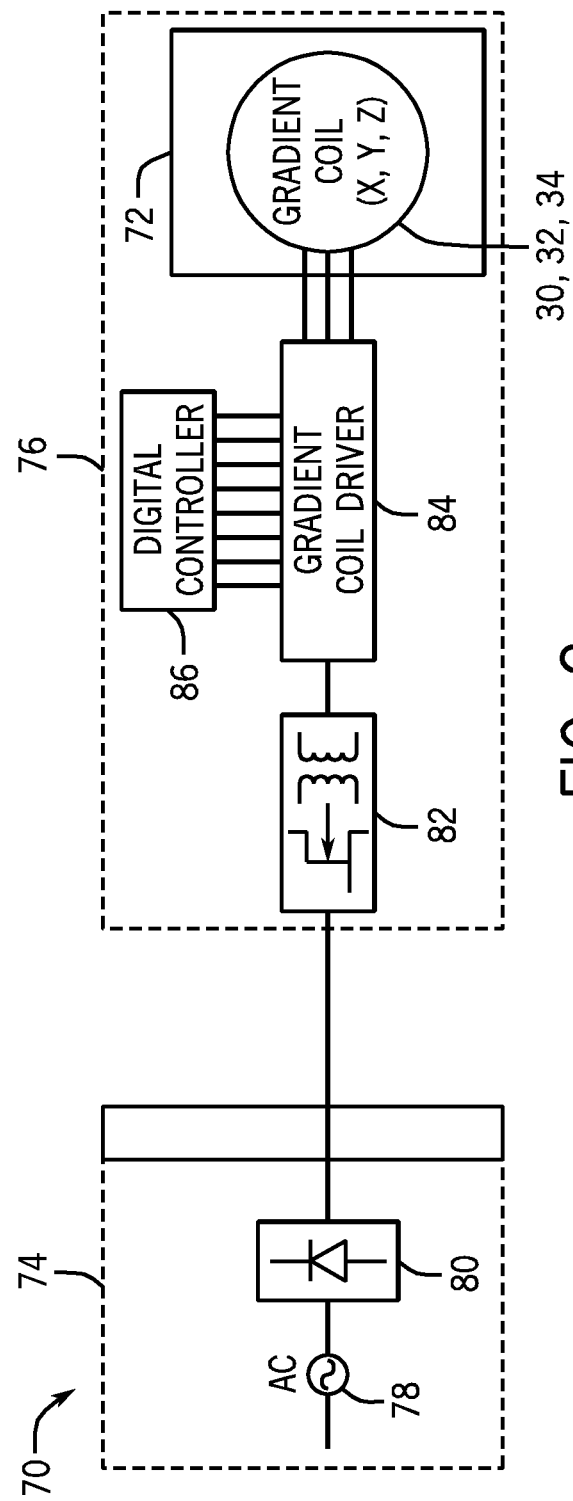
FIG. 2 is a system-level diagram of the power systems driving a gradient coil of a magnetic resonance imaging (MRI) machine according to an embodiment of the disclosure.
Figure 3:
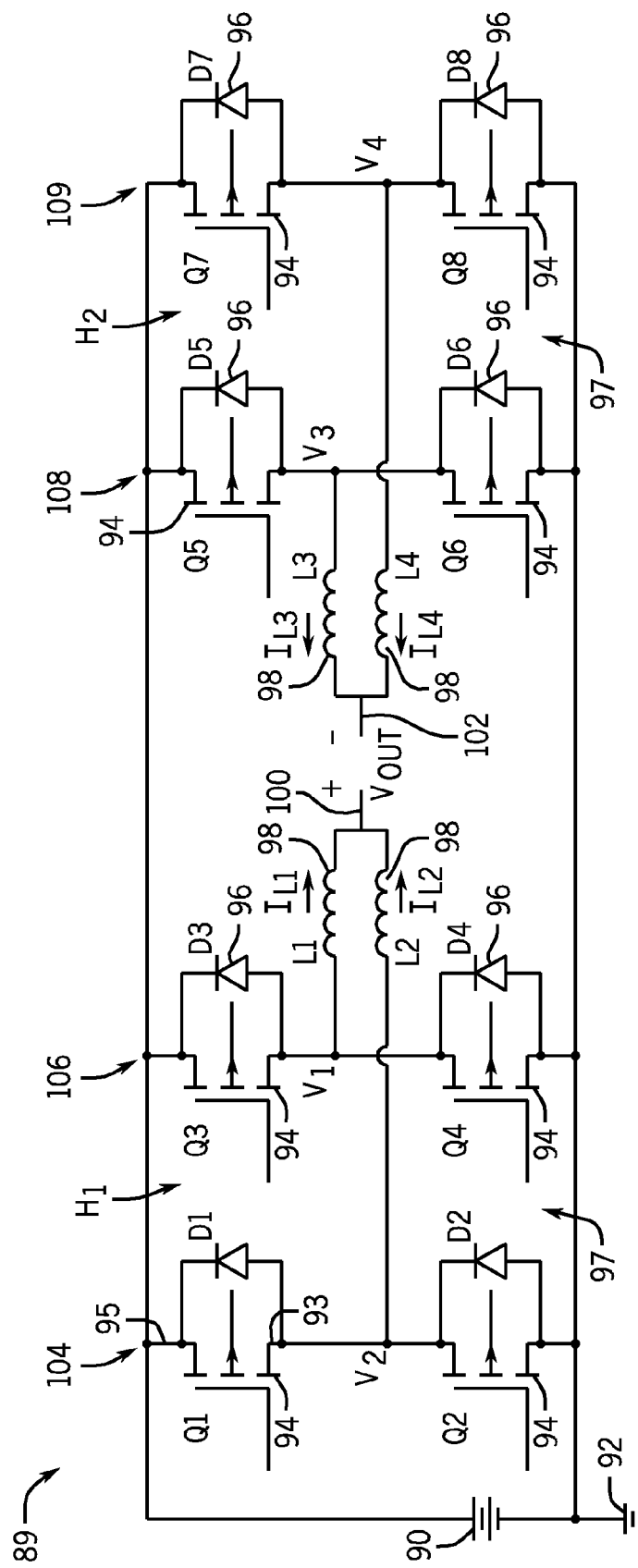
FIG. 3 is a circuit diagram illustrating the switching circuitry of a gradient coil driving circuit, in accordance with an aspect of the present disclosure.

FIG. 3 illustrates an embodiment of switching circuitry 89 of the gradient coil driver 84 shown in FIG. 2. It should be noted that the switching circuitry 89 may be utilized as all or a part of a retrofit kit configured to replace existing circuitry in an existing gradient coil driver. Alternatively, the switching circuitry 89 may be provided in conjunction with the gradient coil driver 84 so as to replace an existing gradient coil driver for an MRI scanner (e.g., scanner 12 of FIG. 1). The kit may include various accessories, such as cables, connectors, and so on, to facilitate such replacement.

With reference to the circuitry 89, a power source 90 may be connected to electric ground 92 and may provide power to the gradient coil driver 84. As illustrated, the gradient coil driver 84 includes eight switches 94, though the driver 84 may include a fewer (e.g., four) or greater (e.g., 12) number of switches. The switches 94 are designated as a first switch Q1, a second switch Q2, a third switch Q3, a fourth switch Q4, a fifth switch Q5, a sixth switch Q6, a seventh switch Q7, and an eighth switch Q8. In the illustrated embodiment, the eight switches 94 are disposed in two separate H-bridges—a first H-bridge H1 and a second H-bridge H2.

The switches 94 may be constructed using any one or a combination of materials including, but not limited to SiC. Indeed, while any suitable material is presently contemplated (e.g., silicon) for use in the switches 94, in one embodiment, the switches 94 may be silicon carbide (SiC) metal-oxide-semiconductor field-effect transistors (MOSFETs). Again, as noted above, it is presently contemplated that some or all of the switches 94 may be insulated-gate bipolar transistors (IGBTs) rather than MOSFETs. Accordingly, while the switches 94 are presently discussed as being SiC MOSFETs, it should be appreciated that their associated descriptions are intended to encompass all variations in material or configuration including, but not limited to, Si MOSFETS and IGBTs. In one embodiment, SiC MOSFETs may be desirable to enable faster switching and a reduction in switching loss compared to other MOSFET materials, including Si.

Each switch 94 may include a diode 96 electrically coupled to the drain and the source of the SiC MOSFET. In particular, as illustrated with respect to the first switch Q1, the diode D1 is positioned electrically parallel with respect to the MOSFET such that a current is allowed to flow from a source 93 of the MOSFET and a to a drain 95 of the MOSFET through the diode D1, rather than through the MOSFET itself (e.g., the channel of the MOSFET). This operation is substantially the same for all of the switches 94. The diodes 96 may enable current to flow between the drain and the source of the SiC MOSFET switches 94 to enable switching of the SiC MOSFET to an "on" state at zero voltage potential. Each SiC MOSFET may be considered to be in an "on" state when it is conducting and in an "off" state when it is not conducting. Each H-bridge 97 of the gradient coil driver 84 may include inductive loads 98 which, in the illustrated embodiment, include a first inductor L1 and a second inductor L2 disposed on the first H-bridge H1, and a third inductor L3 and fourth inductor L4 disposed on the second H-bridge H2). During operation, each inductive load 98 has a current flowing through it, represented as arrows. In particular, during operation, the current flowing through the first inductor L1 is a first current $I_{L1}$, the current flowing through the second inductor L2 is a second current $I_{L2}$, the current flowing through the third inductor L3 is a third current $I_{L3}$, and the current flowing through the fourth inductor L4 is a fourth current $I_{L4}$. The point between the first inductor L1 and the second inductor L2 may be a positive output voltage terminal 100. The point between the third inductor L3 and the fourth inductor L4 may be a negative voltage output terminal 102. The positive output voltage terminal 100 and the negative output voltage terminal 102 may provide a voltage signal ($V_{out}$) to a gradient coil 30, 32, 34 to control the gradient fields being generated by the gradient coil 30, 32, 34.

In accordance with present embodiments, different "on" and "off" states between each of the switches 94 (switch Q1, switch Q2, switch Q3, switch Q4, switch Q5, switch Q6, switch Q7, and switch Q8) may cause a variety of different current flows in each of the inductive loads 98 (e.g., L1-L4). For example, referring to the first H-bridge H1, in embodiments where both the first and third switches Q1 and Q3 are turned on, voltage reference V1, which is measured on a first leg 104 of the first H-bridge H1 between the first and second switches Q1 and Q2, and voltage reference V2, which is measured on a second leg 106 of the first H-bridge H1 between the third and fourth switches Q3 and Q4, may both have a voltage substantially equal to the voltage of the power source 90. Because there is no voltage difference between the first inductor L1 and the second inductor L2, both the first current $I_{L1}$ and the second current $I_{L2}$ may be substantially constant currents. However, if the second and third switches Q2 and Q3 are turned on, voltage reference V1 may have a voltage substantially equal to the power source 90 voltage and voltage reference V2 may have a voltage substantially equal to the voltage of the electrical ground 92. This voltage difference across the inductive loads 98 may cause a differential current in each of the inductive loads 98. In this case, the first current $I_{L1}$ may increase at a constant rate and the second current $I_{L2}$ may decrease at a constant rate. The other H-bridge of the gradient coil driver 84 behaves similarly. For example, if the sixth switch Q6 and the eighth switch Q8 are turned on, voltage reference V3, which is measured on a first leg 108 of the second H-bridge H2 between the fifth and sixth switches Q5 and Q6, and voltage reference V4, which is measured on a second leg 109 of the second H-bridge H2 between the seventh and eighth switches Q7 and Q8, may both have voltages substantially equal to the voltage of the electric ground 92. As before, since there is no voltage difference between voltage reference V3 and voltage reference V4, both the third current $I_{L3}$ and the fourth current $I_{L4}$ will be constant currents. In the above-mentioned situations, even in situations where a switch is turned off, the diodes 96 (diode D1, diode D2, diode D3, diode D4, diode D5, diode D6, diode D7, diode D8) may allow current to flow and change the voltage of one of the voltage references (e.g., V1, V2, V3, and/or V4).

Figure 4:
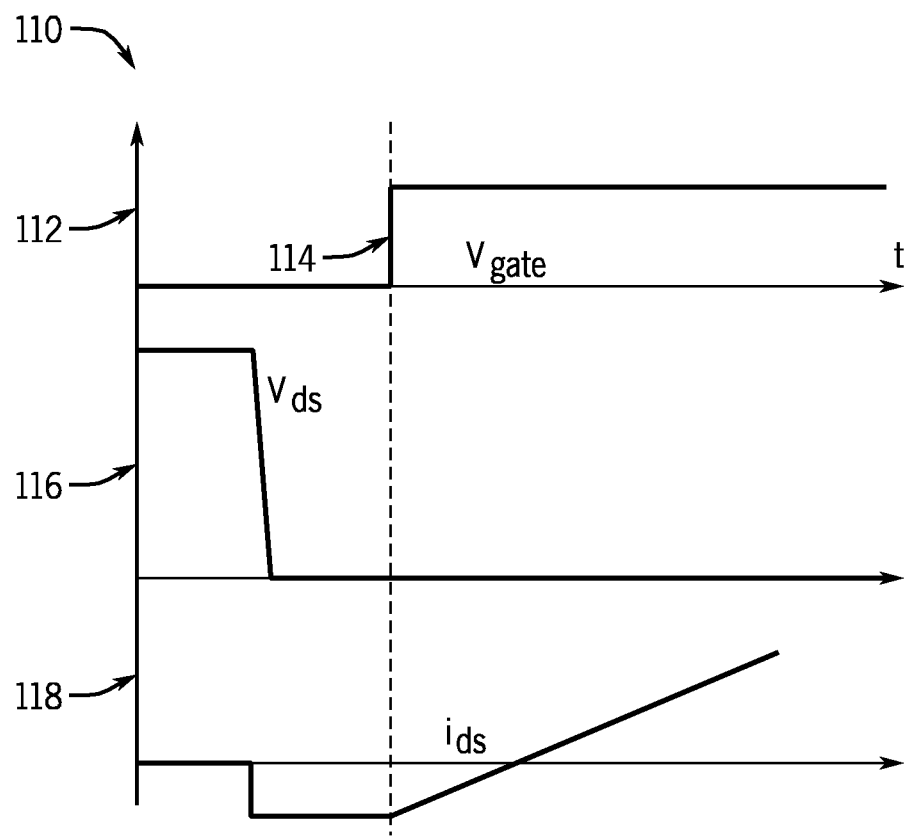
FIG. 4 is a graph depicting the conditions for zero-voltage switching in a silicon carbide (SiC) metal-oxide-semiconductor field-effect transistor (MOSFET), in accordance with an aspect of the present disclosure.

As noted above, hard switching of the SiC MOSFET switches 94 shown in FIG. 3 may cause switching loss in the gradient coil driver 84. The more efficient process of soft switching may be achieved in the gradient coil driver 84 by implementing zero-voltage switching for switching the SiC MOSFET switches 94. FIG. 4 is a graph 110 depicting one embodiment of conditions suitable for such zero-voltage switching in a SiC MOSFET, such as the SiC MOSFETs of gradient coil driver 84 of FIG. 3. A gate voltage profile 112 represents the gate voltage of one of the SiC MOSFET switches 94 versus time. The gate voltage profile 112 includes a rising edge 114 where voltage is applied to the gate of the SiC MOSFET switch 94. A drain-source voltage profile 116 represents the voltage across the drain and the source of the SiC MOSFET switch 94. A drain-source current profile 118 represents the current flowing through the drain and the source of the SiC MOSFET switch 94, with the negative current representing conductance in a direction from the source to the drain of the SiC MOSFET. Zero-voltage switching may occur when the drain-source voltage is zero, and a voltage is applied to the gate as represented by rising edge 114. When the drain-source voltage is zero, a small negative drain-source current may flow (e.g., due to the presence of the switch's associated diode 96), which facilitates a constant increase in the drain-source current after the rising edge 114 (i.e., an application of voltage) occurs. In other words, the MOSFET is driven to conduct current in a direction from the drain to the source, which is opposite its usual conductance when in an "on" state. Thus, when a voltage is applied to the gate of the MOSFET to enable switching to its usual source-drain conductance, the MOSFET has a smooth transition from its "off" state to its "on" state, rather than the sharp transition that would be obtained using a hard switching approach. This zero-voltage switching approach may also decreases the losses associated with such hard switching approaches. It should be noted, however, that in other embodiments, zero-voltage switching may occur when no drain-source current is flowing if the drain-source voltage is zero.

Figure 5:
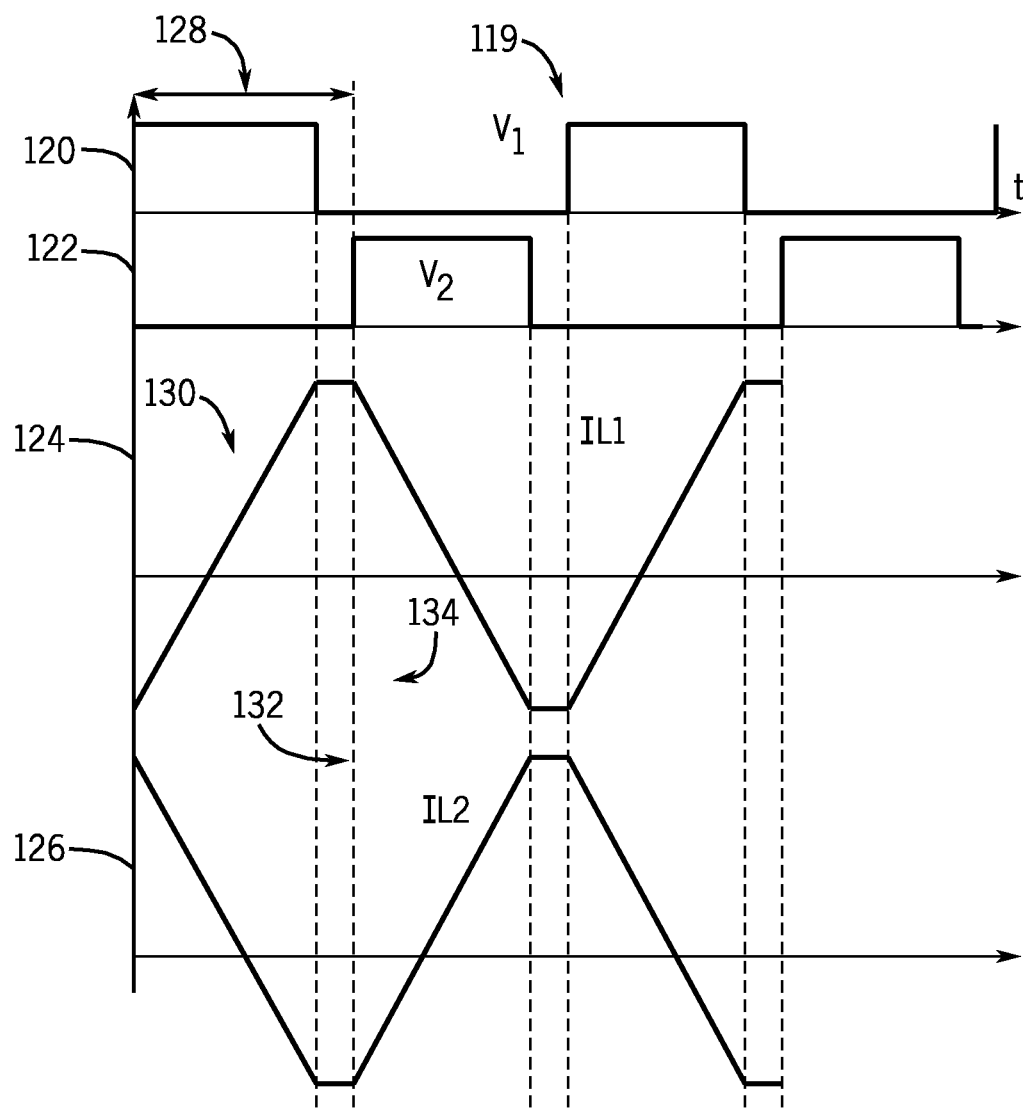
FIG. 5 is a voltage and current profile showing the relation between the possible voltages on either side of an inductive load of a gradient coil driving circuit and the current flowing through the inductive load, in accordance with an aspect of the present disclosure.

In accordance with present embodiments, the zero-voltage switching described in FIG. 4 may be facilitated by a phase shift in voltage signals applied to the voltage reference points mentioned above. FIG. 5 depicts a series of voltage and current profiles relating the phase shift of voltage signals applied to the voltage reference points and the currents flowing through the inductive loads 98 of FIG. 3. In the plot 119, a voltage V1 profile 120 represents the voltage of voltage reference V1 versus time. Likewise, a voltage V2 profile 122 represents the voltage of voltage reference V2 versus time. Current $I_{L1}$ profile 124 represents the current flowing through inductor L1 (current $I_{L1}$) versus time. Current $I_{L2}$ profile 126 represents the current flowing through inductor L2 (current $I_{L2}$) versus time. The voltage signal represented by the voltage profile 120 and the voltage signal represented by the voltage profile 122 may be periodic and may be relatively high for a percentage of their respective durations. The percentage at this high voltage may be referred to as the duty cycle of the signal. In accordance with an embodiment, the voltage signal of voltage reference V1 and the voltage signal of voltage reference V2 (e.g., the voltage references within the same H-bridge) may both have the same duty cycle. The voltage signal of voltage reference V1 (represented by profile 120) and the voltage signal of voltage reference V2 (represented by profile 122) may have a phase shift 128 between them that facilitates zero-voltage switching by causing the current flowing through the inductive load 98 to be negative before the corresponding SiC MOSFET switch 94 is turned on. As depicted, during a first time segment 130, the voltage signal of voltage reference V1 is high and the voltage signal of voltage reference V2 is low, causing a voltage difference on each side of the inductive loads 98. The voltage difference may facilitate an increase in the current the first current $I_{L1}$ through the first inductor L1 and a decrease in the second current $I_{L2}$ through the second inductor L2. During a second time segment 132, both the voltage signal of voltage reference V1 and the voltage signal of voltage reference V2 are low and, in certain embodiments, there may be no substantial voltage difference on each side of the first and second inductors L1 and L2. In such embodiments, both current $I_{L1}$ and current $I_{L2}$ remain substantially constant. During a third time segment 134, the voltage signal of voltage reference V1 is low and the voltage signal of voltage reference V2 is high, causing a voltage difference on each side of the first and second inductors L1 and L2. The voltage difference may facilitate an increase in the first current $I_{L1}$ and a decreasing in the second current $I_{L2}$. When either of the first or second currents $I_{L1}$, $I_{L2}$ is negative, the corresponding SiC MOSFET switch 94 may be turned on with zero-voltage switching and thus, minimal switching losses.

Figure 6:
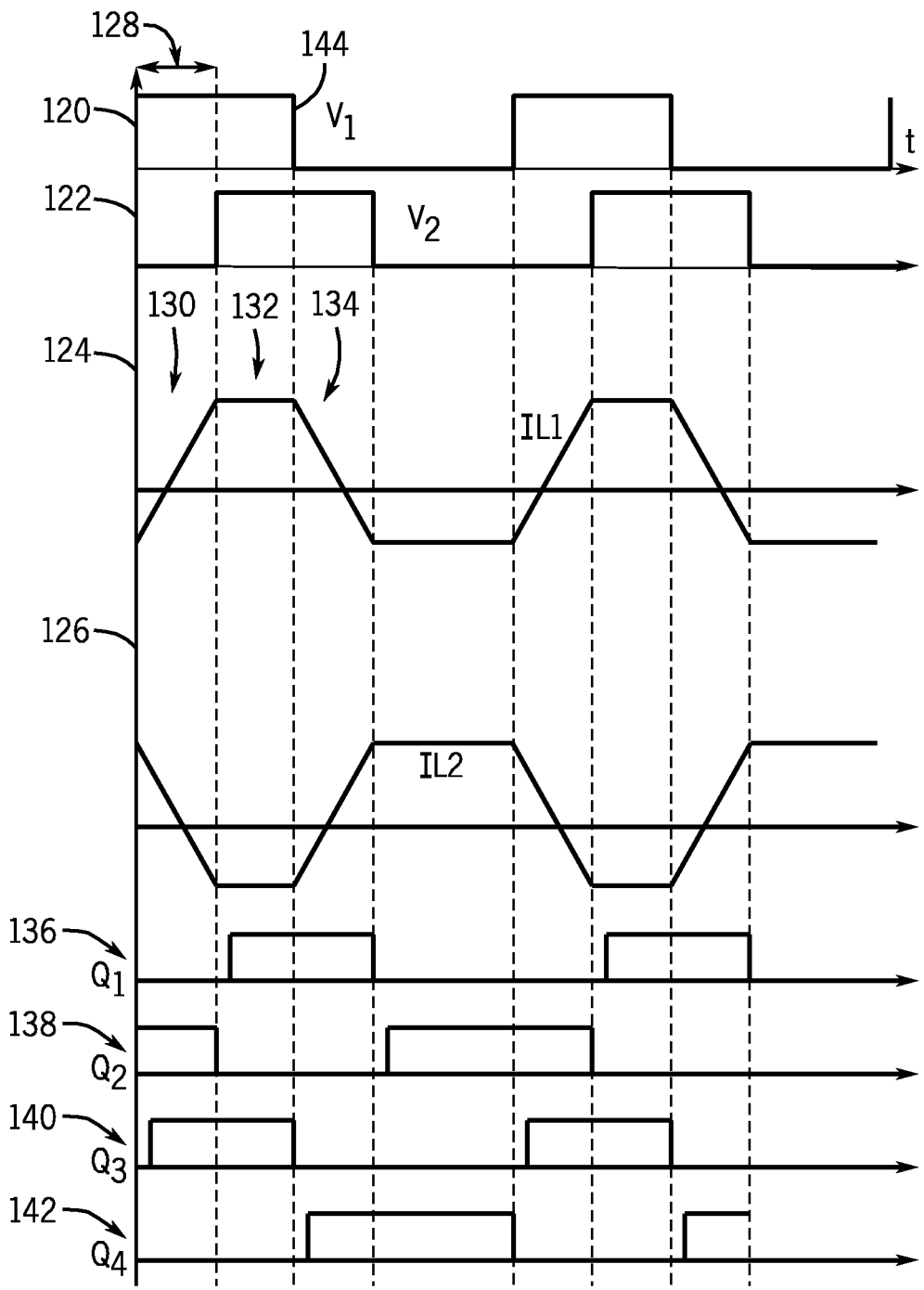
FIG. 6 is a voltage and current profile showing the relation between the possible voltages on either side of an inductive load of a gradient coil driving circuit and the current flowing through the inductive load, and a time profile outlining the times that devices in the gradient coil driving circuit allow current to flow, in accordance with an aspect of the present disclosure.

Like FIG. 5, FIG. 6 depicts a series of voltage and current profiles relating the phase shift of voltage signals applied to the voltage reference points (e.g., V1, V2) and the currents flowing through the inductive loads 98 (e.g., first and second inductors L1, L2). FIG. 6 also depicts profiles for each device in the gradient coil driver 84 illustrating the times that each device turns on or allows current to flow in relation to voltage and current profiles of the gradient coil driver 84. In FIG. 6, the phase shift 128 is smaller than the phase shift 128 of FIG. 5. Because of the smaller phase shift 128, the first time segment 130 has a shorter duration. Since the first current $I_{L1}$ may increase for a shorter duration, the first current $I_{L1}$ may have a lower maximum current. Additionally, because of the smaller phase shift 128, the first and second currents $I_{L1}$, $I_{L2}$ may be constant for a longer period of time in the second time segment 132 compared to the embodiment of FIG. 5.

The device gating profiles (switch Q1 profile 136, switch Q2 profile 138, switch Q3 profile 140, switch Q4 profile 142) represent the gating timing for the SiC MOSFET switches 94. An upward pulse represents a device is turned on, and a downward tick mark represents a device is turned off. At time t=0 in the first time segment 130, the first current $I_{L1}$ is negative and Q4 is off, meaning that current may be flowing through the third diode D3. Before the first current $I_{L1}$ increases to zero, the third switch Q3 may turn on via zero-voltage switching and allow current to flow from the power source 90, making the first current $I_{L1}$ increasingly positive. Once the first current $I_{L1}$ shifts from negative to positive, the third diode D3 may no longer be conductive (i.e., may no longer pass current in its intended direction). After a predetermined amount of time, the third switch Q3 may turn off, causing the fourth diode D4 100 to become conductive (i.e., may pass current in its intended direction). Once the fourth diode D4 100 is conductive, the voltage at voltage reference V1 may drop from a relatively high voltage to a relatively low voltage, as represented by a falling edge 144, and the first current $I_{L1}$ may begin to decrease. As the first current $I_{L1}$ decreases to zero, the fourth switch Q4 may turn on via zero-voltage switching. Once the first current $I_{L1}$ shifts from positive to negative, the fourth diode D4 may stop conducting current. The fourth switch Q4 may turn off after a predetermined amount of time and cause the third diode D3 to become conductive. This pattern of turning devices on and off may be repeated to generate the profiles depicted in FIG. 6.

A similar method of operation may generate the graph of the second current $I_{L2}$ illustrated in FIG. 6. At time t=0 in the first time segment 130, the second current $I_{L2}$ is decreasing and the voltage at voltage reference V2 is low. Accordingly, current is flowing through the second diode D2. As the second current $I_{L2}$ decreases to zero, the second switch Q2 may turn on with zero-voltage switching. After a predetermined amount of time, the second switch Q2 may turn off, causing the first diode D1 to become conductive. Once the first diode D1 is conductive, the voltage at voltage reference V2 may become high and the second current $I_{L2}$ may become constant. The second current $I_{L2}$ may remain constant until the voltage at voltage reference V1 becomes low and the second current $I_{L2}$ may begin to increase. As the second current $I_{L2}$ increases to zero, the first switch Q1 may turn on with zero-voltage switching. Once the second current $I_{L2}$ shifts from negative to positive, the first diode D1 may stop conducting current. After a predetermined amount of time, the first switch Q1 may turn off, causing the second diode D2 to become conductive. Once the second diode D2 is conductive, the voltage at voltage reference V2 may become low and the second current $I_{L2}$ may become constant. The second current $I_{L2}$ may remain constant until the voltage at voltage reference V1 becomes high and the second current $I_{L2}$ may begin to decrease. As the second current $I_{L2}$ decreases to zero, the second switch Q2 may turn on with zero-voltage switching. The timing of the gate voltages applied to the MOSFET switches 94 may be controlled by a digital controller, such as the control and analysis circuitry 52 of FIG. 1.

Figure 7:
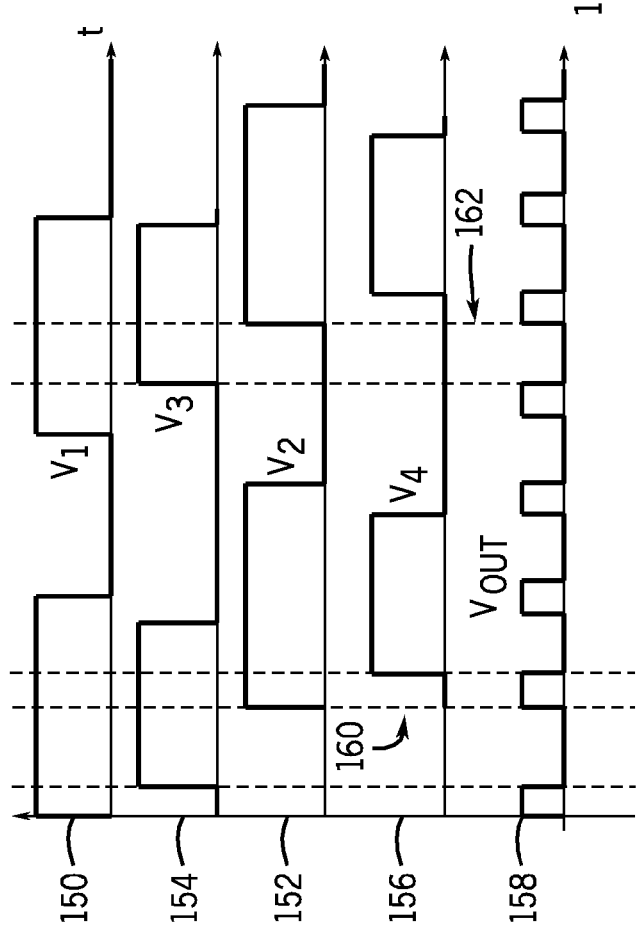
FIG. 7 is a voltage profile showing the relation between the possible voltages on either side of the inductive loads of each side of a two phase H-bridge gradient driving circuit and the output voltage being supplied to a gradient coil.

The phase shifting method illustrated in FIGS. 5 and 6 may be extended to the second H-bridge H2 of the gradient coil driver 84 in order to introduce a periodic voltage signal across the positive output terminal 100 and the negative output terminal 102. FIG. 7 illustrates the relation between the possible voltages on either side of the inductive loads 98 of each of the H-bridges H1, H2 and the output voltage being supplied to the gradient coil 30, 32, 34. In FIG. 7, voltage V1 profile 150 and voltage V2 profile 152 may represent signals having substantially the same duty cycle, but with a phase shift therebetween. Likewise, voltage V3 profile 154 and voltage V4 profile 156 may represent signals with substantially the same duty cycle, but with a phase shift therebetween. Output voltage profile 158 may represent the voltage being generated across the positive output terminal 100 and the negative output terminal 102 ($V_{out}$). The output voltage being generated across the positive output terminal 100 and the negative output terminal 102 may be proportional to the value obtained from the sum of voltages V1 and V2 minus the sum of the voltages V3 and V4. For example, in a first window 160, voltage V1 is high, voltage V2 is high, voltage V3 is high, and voltage V4 is low. Thus, the first H-bridge H1, having the positive output terminal 100 (voltage V1 and voltage V2), has two high voltages while the second H-bridge H2 having the negative output terminal 102 (voltage V3 and voltage V4), has one high voltage. Therefore, there is a net of one high voltage, resulting in a positive output voltage. On the other hand, in a second window 162, voltage V1 is high, voltage V2 is low, voltage V3 is high, and voltage V4 is low. In this case, both of the first and second H-bridges H1, H2 have one high voltage, resulting in no net voltage, and a low, or substantially zero output voltage.

Figure 8:
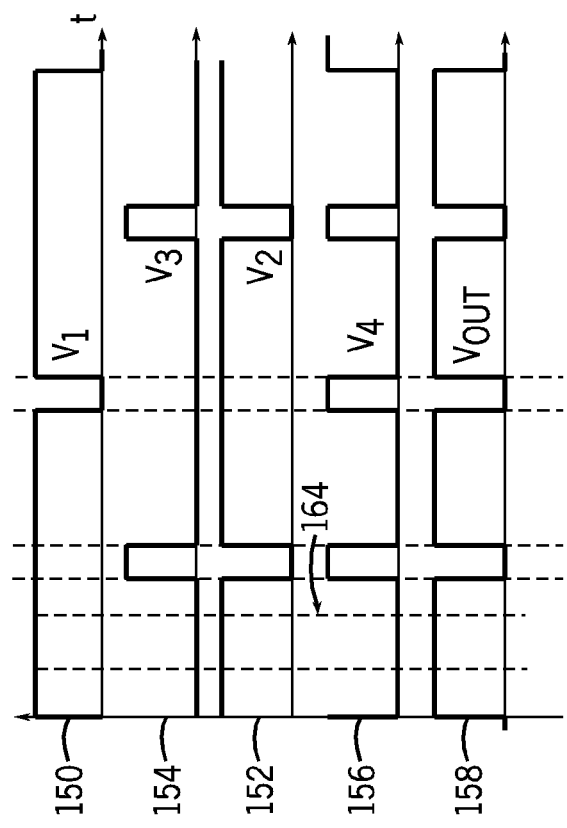
FIG. 8 is a voltage profile showing the relation between the possible voltages on either side of the inductive loads of each side of a two phase H-bridge gradient driving circuit and the output voltage being supplied to a gradient coil, in accordance with an aspect of the present disclosure.

FIG. 8 depicts the manner in which a larger duty cycle on the first H-bridge H1 having the positive output terminal 100 may increase the output voltage represented by the output voltage profile 158. In a third window 164, voltage V1 (as represented by profile 150) is high, voltage V2 (as represented by profile 152) is high, voltage V3 (as represented by profile 154) is low, and voltage V4 (as represented by profile 156) is low. Therefore, there is a net of two high voltages between the first and second H-bridges H1, H2, and the output voltage depicted by the output voltage profile 158 is approximately twice as high as the output voltage shown in FIG. 7. Thus, different combinations of duty cycles of the voltages V1-V4 and phase shifts therebetween may enable the digital controller 86 to manipulate the net output voltage of the gradient coil driver 84.

While, in certain embodiments, increasing the duty cycle of the voltages on the first H-bridge H1 may increase the output voltage of the gradient coil driver 84, in other embodiments, certain combinations of duty cycles and phase shifts may not facilitate zero-voltage switching of the SiC MOSFET switches 94. Indeed, it should be noted that the phase shift angle and duty cycle may be managed or controlled in order to achieve zero voltage switching.

Figure 9:
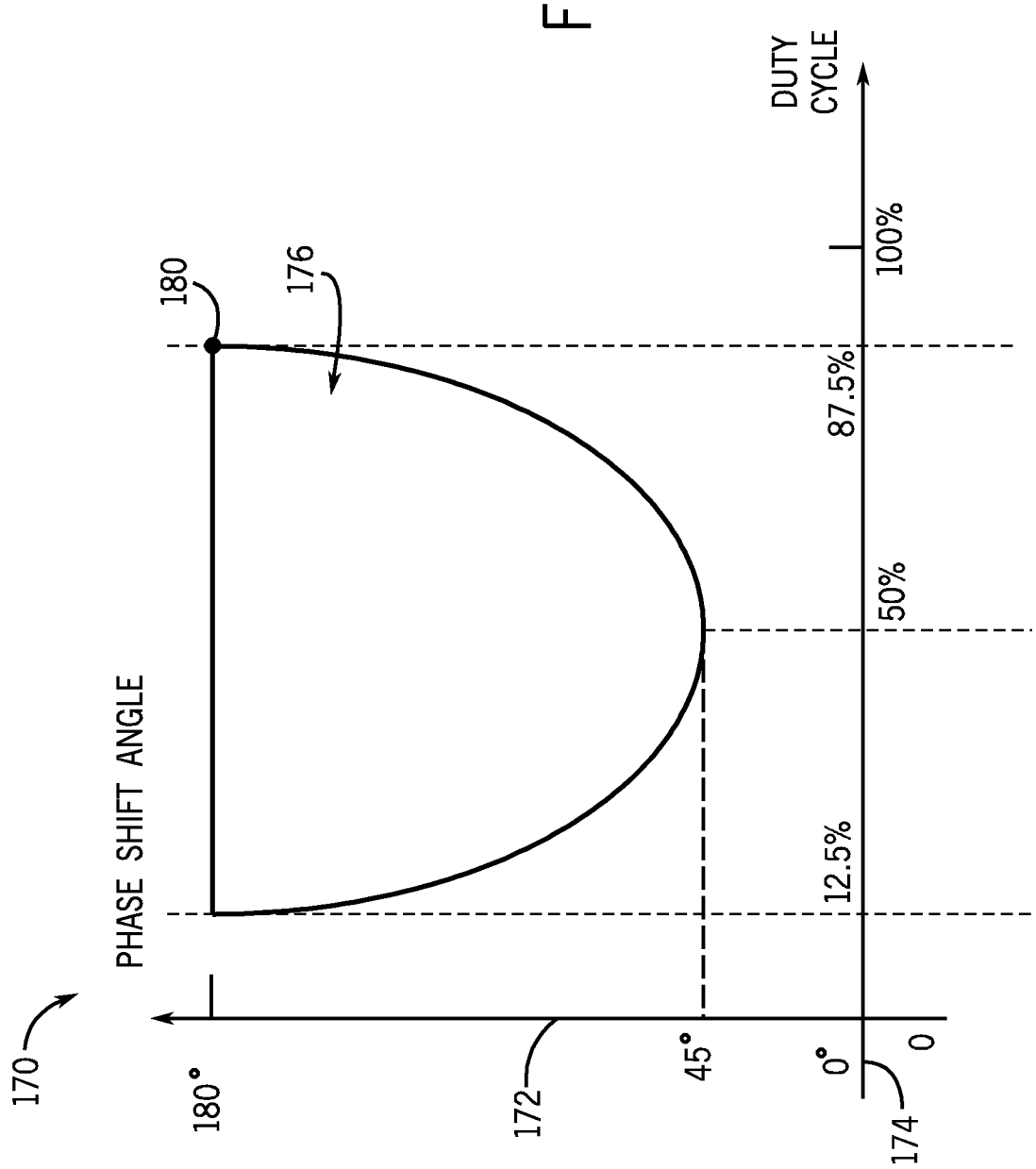
FIG. 9 is a graph visually depicting a region of duty cycles and phase shifts for which zero-voltage switching is possible in the SiC MOSFETs in a gradient driving circuit, in accordance with an aspect of the present disclosure.

FIG. 9 is a plot 170 depicting a region of duty cycles and phase shifts suitable for achieving zero-voltage switching in the SiC MOSFET switches 94 described herein. In particular, the plot 170 depicts phase shift angle 172 as a function of duty cycle 174. The duty cycle 174 represents the value of the duty cycle for voltage V1 and voltage V2. In certain embodiments, the duty cycles for voltage V3 and voltage V4 may be complimentary to voltage V1 and V2. For example, if the duty cycle of voltage V1 and voltage V2 is 87.5%, then the duty cycle of voltage V3 and voltage V4 may be 12.5%. Thus, the plot 170 may be suitable for embodiments where voltage V3 and voltage V4 are complimentary to voltage V1 and voltage V2.

The phase shift angle 170 represented in the plot 170 is the phase shift angle between the combination of voltages V1 and V2, and the combination of voltages V3 and V4. A graph area 176 represents the range of duty cycles and phase shift angles where zero-voltage switching may be achieved.

Figure 10:
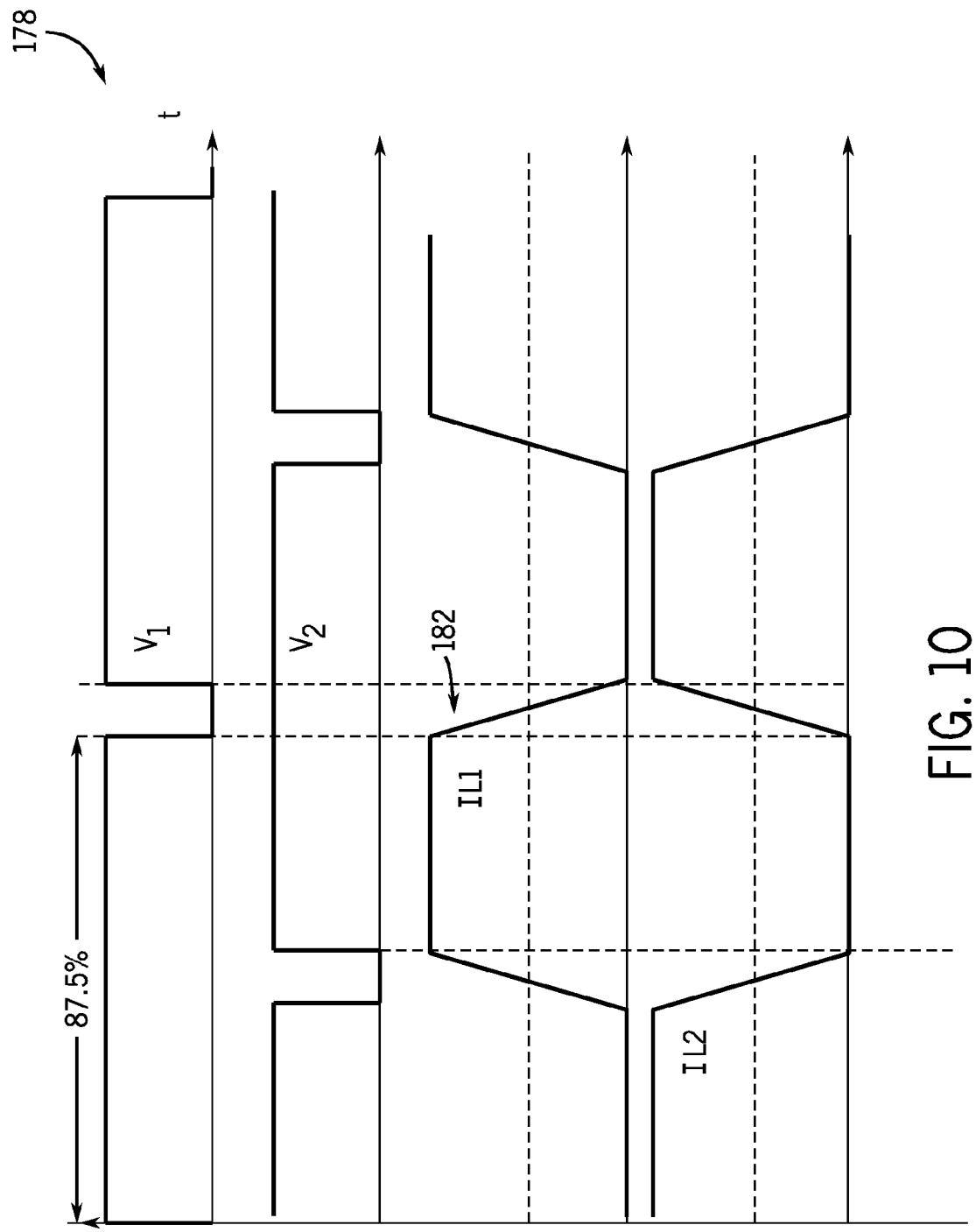
FIG. 10 is a voltage and current profile depicting a boundary for zero-voltage switching based on the duty cycle and phase shift angle, in accordance with an aspect of the present disclosure.

It should be noted that boundaries on the graph area 176 may exist because the combination of the duty cycle and the phase shift angle may not facilitate the production of a voltage difference across the inductive loads for a sufficient duration to cause negative current to flow. FIG. 10 illustrates a voltage and current profile 178 that, in some embodiments, may correspond to a boundary on the graph area 176 of FIG. 9. In the illustrated embodiment, the duty cycle for the voltage signals is 87.5% and the phase shift angle is 180°, as represented by a point 180 on the plot 170. In a time window 182, voltage V1 may drop from high voltage to low voltage while voltage V2 may remain high, causing a decrease in the first current $I_{L1}$. As noted above with respect to FIG. 6, zero-voltage switching in the third switch Q3 may occur when the first current $I_{L1}$ is zero or negative, in order to enable zero-voltage switching. Thus, at the end of the time window 180, the third switch Q3 may be turned on and voltage V1 may rise from a low voltage to a high voltage. The third switch Q3 may be turned on at nearly the same moment that the decreasing first current $I_{L1}$ reaches zero, facilitating zero-voltage switching. If the duty cycle were larger, the first current $I_{L1}$ may not necessarily have a sufficient amount of time to reach zero (or a negative value), which may prevent zero-voltage switching. Smaller duty cycles may enable the first current $I_{L1}$ enough time to reach a suitably negative value.

FIG. 10 also illustrates the manner in which varying the phase shift angle and duty cycle of voltages V1 and V2 may facilitate zero-voltage switching in the SiC MOSFET switches 94. Similarly, varying the inductance values of the inductors 98 may also facilitate zero-voltage switching. For example, smaller inductances may increase the rate of change of the first and second currents $I_{L1}$ and $I_{L2}$. Conversely, larger inductances may decrease the rate of change of the first and second currents $I_{L1}$ and $I_{L2}$. Because a quick transition from positive current to negative current may be one criterion for zero-voltage switching, smaller inductances may facilitate zero-voltage switching for duty cycle and phase shift angle combinations outside the graph area 176 shown in FIG. 9.

Technical effects of the invention include an electronic circuit configured to provide a periodic voltage signal to a gradient coil of a magnetic resonance imaging (MRI) scanner with minimal switching loss. In certain implementations, the electronic circuit includes two H-bridge circuits with silicon carbide (SiC) metal-oxide-semiconductor field-effect transistors (MOSFETs) used as switches. A diode is connected in parallel with each SiC MOSFET to allow the voltage to equalize on each side of each of the SiC MOSFETs to facilitate zero-voltage switching to an "on" state from an "off" state. Each H-bridge circuit includes two inductive loads in series. Between each pair of inductive loads are terminals for the final voltage output to the gradient coil. During operation, a digital controller sends signals to each of the SiC MOSFET switches to turn them on and off in specific periodic patterns to generate voltages on either side of the inductive loads that have varying duty cycles and phase shift angles. Certain combinations of duty cycles and phase shift angles between the voltages on either side of the inductive load cause a negative current offset in the inductive loads. During the negative current offset period, the diodes are conducting, enabling zero-voltage switching on the SiC MOSFETs with minimal losses.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A system, comprising:
a gradient coil driver configured to supply electrical signals to a gradient coil of a magnetic resonance imaging (MRI) system, wherein the gradient coil driver comprises
an electronic circuit that provides a voltage signal to a gradient coil of the MRI system to maintain a soft switching condition comprising:
a first H-bridge circuit electrically coupled to a power source, wherein the first H-bridge comprises:
a plurality of metal-oxide-semiconductor field-effect transistor (MOSFET) switches;
a plurality of diodes electrically coupled in parallel with each MOSFET switch, wherein each diode of the plurality of diodes is configured to conduct current to cause zero voltage potential across a source and a drain of one of the plurality of MOSFET switches; and
a load configured to regulate currents flowing through each of the plurality of diodes and each MOSFET switch of the plurality of MOSFET switches, wherein the load comprises one or more inductors disposed on the first H-bridge, the inductors having inductance values such that varying the inductance values to facilitate the soft switching;
wherein the plurality of MOSFET switches comprise first and second MOSFET switches disposed on a first leg of the first H-bridge, and third and fourth MOSFET switches disposed on a second leg of the first H-bridge; and
wherein a first voltage reference on a first side of the load is positioned on the second leg between the third and fourth MOSFET switches, and a second voltage reference on a second side of the load is positioned on the first leg between the first and second MOSFET switches.

2. The system of claim 1, comprising a digital controller configured to apply signals to gates of the MOSFET switches to enable periodic voltage signals on either side of the load, wherein a phase shift angle and a duty cycle value of the periodic voltage signals is determined by the digital controller to determine the characteristics of an output voltage signal of the electronic circuit.

3. The system of claim 2, wherein the characteristics of the output voltage signal comprise a duty cycle of the output voltage signal, an amplitude of the voltage signal, or a combination thereof.

4. The system of claim 1, wherein each MOSFET switch is a SiC MOSFET switch.

5. The system of claim 1, wherein the electronic circuit comprises a second H-bridge circuit electrically coupled to the power source, comprising:
an additional plurality of MOSFET switches;
an additional plurality of diodes electrically coupled in parallel with each MOSFET switch of the additional plurality of MOSFET switches, wherein each diode of the additional plurality of diodes is configured to conduct current to cause zero voltage potential across a source and a drain of one of the additional plurality of MOSFET switches; and
an additional load configured to regulate currents flowing through each of the additional plurality of diodes and each MOSFET switch of the additional plurality of MOSFET switches.

6. The system of claim 1, wherein each diode of the plurality of diodes is configured to conduct current from the source to the drain of one of the plurality of MOSFET switches such that a voltage across the drain and the source of the MOSFET is substantially zero before voltage is applied to the gate of the MOSFET to conduct current.

7. A retrofit kit, comprising:
an electronic circuit configured to replace an existing electronic circuit in a gradient coil driver configured to supply electrical signals to a gradient coil of a magnetic resonance imaging system; and
wherein the electronic circuit comprises:
a first H-bridge circuit electrically coupled to a power source, wherein the first H-bridge comprises:
a plurality of metal-oxide-semiconductor field-effect transistor (MOSFET) switches;
a plurality of diodes electrically coupled in parallel with each MOSFET switch, wherein each diode of the plurality of diodes is configured to conduct current to cause zero voltage potential across a source and a drain of one of the plurality of MOSFET switches; and
a load configured to regulate currents flowing through each of the plurality of diodes and each MOSFET switch of the plurality of MOSFET switches, wherein the load comprises one or more inductors disposed on the first H-bridge, the inductors having inductance values such that varying the inductance values to facilitate the soft switching;
wherein the plurality of MOSFET switches comprises first and second MOSFET switches disposed on a first leg of the first H-bridge, and third and fourth MOSFET switches disposed on a second leg of the first H-bridge, wherein a first voltage reference on a first side of the load is positioned on the second leg between the third and fourth MOSFET switches, and a second voltage reference on a second side of the load is positioned on the first leg between the first and second MOSFET switches.

8. The kit of claim 7, comprising a digital controller configured to apply signals to gates of the MOSFET switches to enable periodic voltage signals on either side of the load, wherein a phase shift angle and a duty cycle value of the periodic voltage signals is determined by the digital controller to determine the characteristics of an output voltage signal of the electronic circuit.

9. The kit of claim 8, wherein the characteristics of the output voltage signal comprise a duty cycle of the output voltage signal, an amplitude of the voltage signal, or a combination thereof.

10. The kit of claim 7, wherein the electronic circuit comprises a second H-bridge circuit electrically coupled to the power source, comprising:
an additional plurality of MOSFET switches;
an additional plurality of diodes electrically coupled in parallel with each MOSFET switch of the additional plurality of MOSFET switches, wherein each diode of the additional plurality of diodes is configured to conduct current to cause zero voltage potential across a source and a drain of one of the additional plurality of MOSFET switches; and
an additional load configured to regulate currents flowing through each of the additional plurality of diodes and each MOSFET switch of the additional plurality of MOSFET switches, wherein the additional load comprises one or more inductors disposed on the first H-bridge, the inductors having inductance values such that varying the inductance values to facilitate the soft switching.

11. The kit of claim 7, wherein each diode of the plurality of diodes is configured to conduct current from the source to the drain of one of the plurality of MOSFET switches such that a voltage across the drain and the source of the MOSFET is substantially zero before voltage is applied to the gate of the MOSFET to conduct current.

12. The kit of claim 7, wherein each MOSFET switch is a SiC MOSFET switch.

13. The kit of claim 7, wherein the load comprises one or more inductors.

14. A magnetic resonance imaging (MRI) system, comprising:
a primary field magnet configured to place gyromagnetic nuclei within a patient into an equilibrium magnetization;
a plurality of gradient coils configured to encode positional information into the gyromagnetic nuclei in response to an applied voltage;
a radiofrequency (RF) transmit coil configured to perturb the gyromagnetic nuclei away from their equilibrium magnetization;
control circuitry coupled to the gradient coils, to the RF transmit coil, and to the plurality of RF receiving coils, wherein the control circuitry is configured to apply control signals to the gradient, RF transmit coils, or any combination thereof;
a power system configured to drive the voltage applied to the plurality of gradient coils, wherein the power system comprises:
a gradient coil driver circuit configured to configured to supply electrical signals to at least one of the gradient coils, wherein the gradient coil driver comprises:
an electronic circuit comprising:
one or more H-bridge circuits electrically coupled to a power source, wherein the one or more H-bridges each comprise:
a plurality of metal-oxide-semiconductor field-effect transistor (MOSFET) switches;
a plurality of diodes electrically coupled in parallel with each MOSFET switch, wherein each diode of the plurality of diodes is configured to conduct current to cause zero voltage potential across a source and a drain of one of the plurality of MOSFET switches; and
a load configured to regulate currents flowing through each of the plurality of diodes and each MOSFET switch of the plurality of MOSFET switches, wherein the load comprises one or more inductors disposed on the first H-bridge, the inductors having inductance values such that varying the inductance values to facilitate the soft switching; and
an AC power source configured to provide electrical power;
a diode rectifier configured to convert an alternating current of the electrical power to a direct current; and
a high frequency isolated DC to DC converter configured to convert a first voltage of the electrical power to a second voltage of the electrical power, wherein the converter is configured to provide the electrical power to the first H-bridge.

15. The system of claim 14, wherein the gradient coil driver is configured to utilize soft switching of the MOSFET switches to prevent switching losses.

* * * * *